(12) United States Patent
Henry et al.

(10) Patent No.: US 8,234,543 B2
(45) Date of Patent: Jul. 31, 2012

(54) DETECTION AND CORRECTION OF FUSE RE-GROWTH IN A MICROPROCESSOR

(75) Inventors: G. Glenn Henry, Austin, TX (US); Charles John Holthaus, Round Rock, TX (US); Terry Parks, Austin, TX (US)

(73) Assignee: VIA Technologies, Inc., New Taipei (TW)

( * ) Notice: Subject to any disclaimer, the term of this patent is extended or adjusted under 35 U.S.C. 154(b) by 476 days.

(21) Appl. No.: 12/609,207

(22) Filed: Oct. 30, 2009

(65) Prior Publication Data
US 2010/0229062 A1 Sep. 9, 2010

Related U.S. Application Data

(60) Provisional application No. 61/158,026, filed on Mar. 6, 2009.

(51) Int. Cl.
*G06F 11/00* (2006.01)
(52) U.S. Cl. ........................ 714/764; 714/747
(58) Field of Classification Search .............. 714/724, 714/742, 747, 764
See application file for complete search history.

(56) References Cited

U.S. PATENT DOCUMENTS

| | | | |
|---|---|---|---|
| 5,134,585 A | 7/1992 | Murakami et al. | |
| 5,206,583 A | 4/1993 | Dawson et al. | |
| 5,461,328 A | 10/1995 | Devereaux et al. | |
| 5,517,455 A | 5/1996 | McClure et al. | |
| 5,889,679 A * | 3/1999 | Henry et al. | 716/119 |
| 5,917,764 A | 6/1999 | Ohsawa et al. | |
| 5,946,497 A | 8/1999 | Lee et al. | |
| 5,973,977 A | 10/1999 | Boyd et al. | |
| 6,386,456 B1 | 5/2002 | Chen et al. | |
| 6,622,208 B2 | 9/2003 | North | |
| 6,768,694 B2 | 7/2004 | Anand et al. | |
| 6,876,594 B2 | 4/2005 | Griesmer et al. | |
| 6,915,476 B2 | 7/2005 | Morino et al. | |
| 7,030,641 B1 | 4/2006 | Tang et al. | |
| 7,035,158 B2 | 4/2006 | Kozuka | |
| 7,069,484 B2 | 6/2006 | Beffa | |
| 7,139,944 B2 | 11/2006 | Barbour et al. | |
| 7,206,988 B1 | 4/2007 | Solt et al. | |

(Continued)

OTHER PUBLICATIONS

DeVries, Ann et al., "A logical Approach to NVM Integration in SOC Design." EDN Voice of the Engineer. Jan. 18, 2007 Issue 2. pp. 1-6.

(Continued)

*Primary Examiner* — Marc Duncan
(74) *Attorney, Agent, or Firm* — E. Alan Davis; James W. Huffman

(57) ABSTRACT

A microprocessor includes control hardware that receives and stores control values and provides the control values to circuits of the microprocessor for controlling operation of the microprocessor. The microprocessor also includes a first plurality of fuses selectively blown collectively with a predetermined value, and a second plurality of fuses selectively blown collectively with an error correction value computed from the predetermined value collectively blown into the first plurality of fuses. In response to being reset, the microprocessor reads the first and second plurality of fuses, detects an error in the value read from the first plurality of fuses using the value read from the second plurality of fuses, corrects the value read from the first plurality of fuses back to the predetermined value using the value read from the second plurality of fuses, and uses the corrected predetermined value to write the control values into the control hardware.

36 Claims, 4 Drawing Sheets

U.S. PATENT DOCUMENTS

| | | |
|---|---|---|
| 7,222,274 B2 | 5/2007 | Combs et al. |
| 7,236,007 B1 | 6/2007 | Chang |
| 7,266,025 B2 | 9/2007 | Nagai et al. |
| 7,274,615 B2 | 9/2007 | Nakagawa et al. |
| 7,401,270 B2 | 7/2008 | Hummler |
| 7,411,851 B2 | 8/2008 | Ueda |
| 7,436,718 B2 | 10/2008 | Tanaka et al. |
| 7,458,002 B2 | 11/2008 | Fischer et al. |
| 7,484,140 B2 | 1/2009 | Pelley et al. |
| 7,489,180 B2 | 2/2009 | Marshall |
| 7,551,470 B2 | 6/2009 | Erickson et al. |
| 7,729,163 B2 | 6/2010 | Ramani et al. |
| 7,895,482 B2 | 2/2011 | Fischer et al. |
| 7,966,537 B2 | 6/2011 | Bonaccio et al. |
| 7,978,493 B1 | 7/2011 | Tan et al. |
| 8,077,531 B2 | 12/2011 | Song et al. |
| 8,127,184 B2 | 2/2012 | Mohammad |
| 2003/0110349 A1* | 6/2003 | Zimmerman et al. ........ 711/105 |
| 2003/0131210 A1* | 7/2003 | Mueller ........................ 711/200 |
| 2005/0122800 A1* | 6/2005 | Morino et al. ................ 365/200 |
| 2006/0215433 A1* | 9/2006 | Fischer et al. .................. 365/60 |
| 2008/0256336 A1 | 10/2008 | Henry et al. |
| 2008/0316789 A1 | 12/2008 | Fredeman et al. |
| 2009/0031108 A1 | 1/2009 | Henry et al. |
| 2009/0296511 A1 | 12/2009 | Henry et al. |
| 2011/0035616 A1 | 2/2011 | Henry et al. |
| 2011/0035617 A1 | 2/2011 | Henry et al. |
| 2011/0035622 A1 | 2/2011 | Henry et al. |
| 2011/0035623 A1 | 2/2011 | Gaskins et al. |

OTHER PUBLICATIONS

Shirvani, Philip P. et al., "Software-Implemented EDAC Protection Against SEUs." IEEE Transactions on Reliability. vol. 49, No. 3, Sep. 2000. pp. 273-284.

\* cited by examiner

DETECTION AND CORRECTION OF FUSE RE-GROWTH IN A MICROPROCESSOR

CROSS REFERENCE TO RELATED APPLICATION(S)

This application claims priority based on U.S. Provisional Application, Ser. No. 61/158,026, filed Mar. 3, 2009, entitled DETECTION AND CORRECTION OF FUSE RE-GROWTH IN A MICROPROCESSOR, which is hereby incorporated by reference in its entirety.

FIELD OF THE INVENTION

The present invention relates in general to the use of fuses within microprocessors, and more particularly to the re-growth of blown fuses therein.

BACKGROUND OF THE INVENTION

Modern microprocessors include fuses that may be selectively blown during manufacturing of the microprocessor. The fuses may be selectively blown with control values that are read from the fuses to control operation of the microprocessor. Normally, when a non-blown fuse is read it returns a binary zero, and when a blown fuse is read it returns a binary one (although, of course, the convention could be reversed). However, the present inventors have observed microprocessors operating in the field that have blown fuses that change their value; that is, they return the incorrect binary zero value, in some cases intermittently, even though they returned the correct binary one value when tested during manufacturing. This is referred to as a fuse "re-growing," or fuse "re-growth." That is, a blown fuse may be physically altered by continual operation of the microprocessor such that when read, the fuse returns its non-blown value rather than its blown value. The consequences of this fuse re-growth can be disastrous to the subsequent operation of the microprocessor, depending upon the particular use of the value in the re-grown fuse. Additionally, the symptoms caused by a re-grown fuse can be very difficult to detect during failure analysis. Therefore, what is needed is a way to enable the microprocessor to continue to correctly operate even in the presence of a re-grown fuse.

BRIEF SUMMARY OF INVENTION

In one aspect, the present invention provides a microprocessor. The microprocessor includes control hardware configured to receive and store control values and to provide the control values to circuits of the microprocessor for controlling operation of the microprocessor. The microprocessor also includes a first plurality of fuses, selectively blown collectively with a predetermined value. The microprocessor also includes a second plurality of fuses, selectively blown collectively with an error correction value computed from the predetermined value collectively blown into the first plurality of fuses. In response to being reset, the microprocessor is configured to read the first and second plurality of fuses, detect an error in the value read from the first plurality of fuses using the value read from the second plurality of fuses, correct the value read from the first plurality of fuses back to the predetermined value using the value read from the second plurality of fuses, and use the corrected predetermined value to write the control values into the control hardware.

In another aspect, the present invention provides a method for initializing a microprocessor involving correcting an incorrect value read from a re-grown blown fuse of the microprocessor. The method also includes reading a first and a second plurality of fuses. The first plurality of fuses is selectively blown collectively with a predetermined value. The second plurality of fuses is selectively blown collectively with an error correction value computed from the predetermined value collectively blown into the first plurality of fuses. The method also includes detecting an error in the value read from the first plurality of fuses using the value read from the second plurality of fuses. The method also includes correcting the value read from the first plurality of fuses back to the predetermined value using the value read from the second plurality of fuses. The method also includes using the corrected predetermined value to write control values into control hardware. The control hardware is configured to receive and store the control values and to provide the control values to circuits of the microprocessor for controlling operation of the microprocessor. The reading, detecting, correcting, and using are performed in response to the microprocessor being reset.

In another aspect, the present invention provides a method for manufacturing a microprocessor having a capability to correct an incorrect value read collectively from a plurality of fuses of the microprocessor, the value being incorrect because a blown one or more of the plurality of fuses is returning its non-blown value when read. The method includes computing an error correction value from an input value, wherein at least a portion of the input value is for use in writing to control hardware of the microprocessor for provision by the control hardware to circuits of the microprocessor controlling operation of the microprocessor. The method also includes blowing the input value into a first plurality of fuses of the microprocessor. The method also includes blowing the error correction value into a second plurality of fuses of the microprocessor.

DETAILED DESCRIPTION OF THE INVENTION

Figure 1:
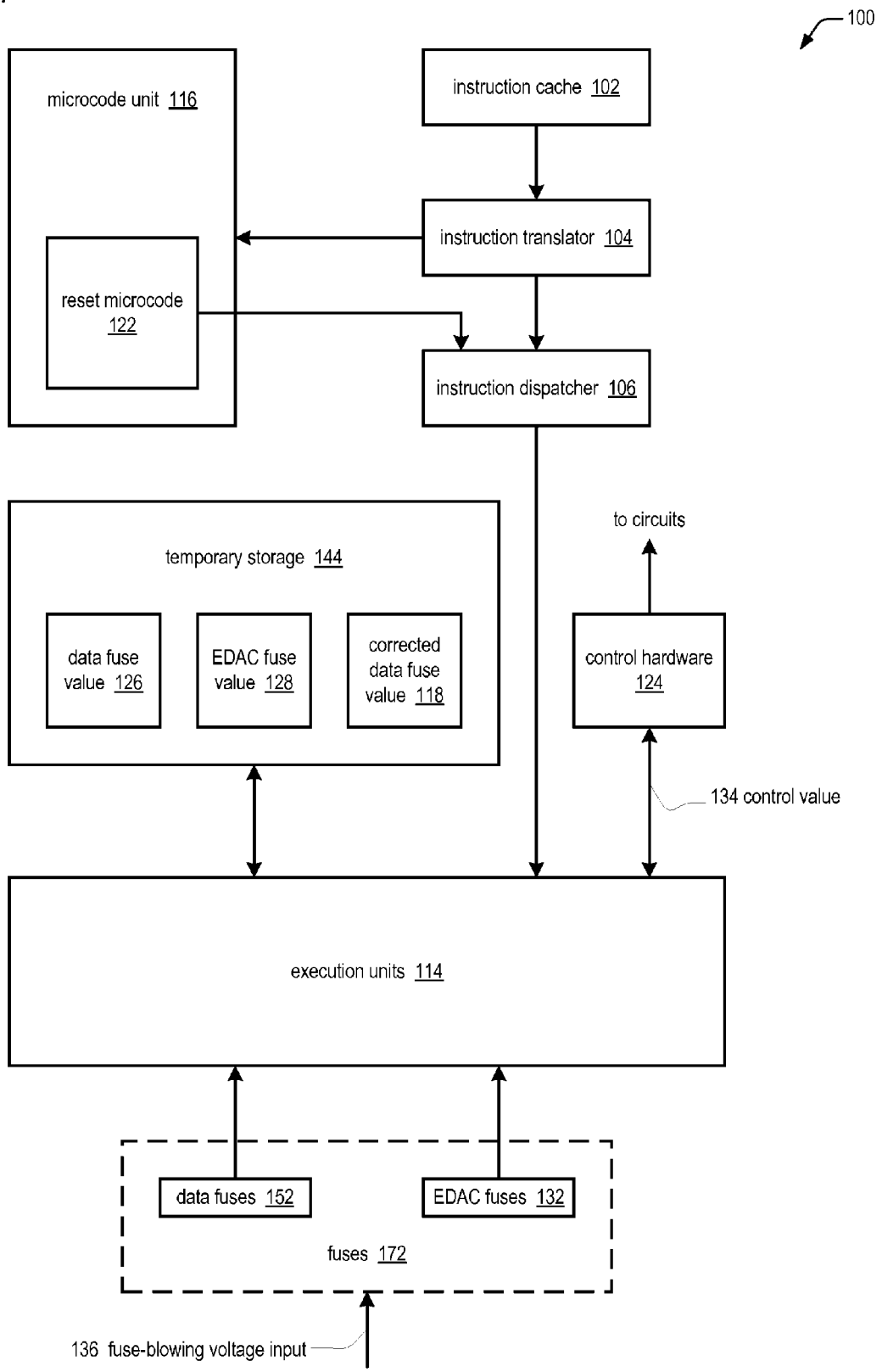
FIG. 1 is a block diagram illustrating a microprocessor according to the present invention.

Referring now to FIG. 1, a block diagram illustrating a microprocessor 100 according to the present invention is shown. The microprocessor 100 includes fuses 172. In one embodiment, the fuses 172 are polysilicon fuses, although other fuse technologies, such as metal fuses, may be employed within the present invention. The fuses 172, although physically the same, are logically allocated as two separate groups, namely data fuses 152 and error detection and correction (EDAC) fuses 132. Whether a particular fuse 172 is allocated as a data fuse 152 or as an EDAC fuse 132, depends upon the particular EDAC algorithm employed by the manufacturer of the microprocessor 100, as described herein.

The fuses 172 are configured such that the manufacturer of the microprocessor 100 may supply a prescribed voltage on an input 136 to the microprocessor 100 in order to selectively blow the fuses 172 on an individual basis. In one embodiment, the manufacturer specifies which fuse 172 to blow via a JTAG scan interface. In one embodiment, one side of each fuse 172 is connected to ground and the other side of the fuse is connected to an active device, such as to an input of a transistor, which is readable by the microprocessor 100. Thus, if a fuse 172 is non-blown, it will conduct and be read as a low voltage (binary zero by convention); whereas, if a fuse 172 is blown, it will not conduct and be read as a high voltage (binary one by convention). Other embodiments are contemplated in which the opposite binary value convention is employed.

Although the fuses 172 may be individually blown during manufacturing and each fuse 172 constitutes a single binary digit (bit), logically the data fuses 152 are viewed as a single entity having a single collective value blown into them, and the EDAC fuses 132 are viewed as a single entity having a single collective value blown into them. The manufacturer computes the single collective value blown into the EDAC fuses 132 using an EDAC algorithm that takes the single value blown into the data fuses 152 as its input, as described in more detail herein.

The microprocessor 100 also includes control hardware 124. The control hardware 124 is configured to receive and store a control value 134 and to provide the control value 134 to various circuits of the microprocessor 100 for controlling operation of the microprocessor 100. The control hardware 124 may include, but is not limited to, the following: microcode patch hardware used for patching microcode (in one embodiment, the patch hardware is substantially similar to that described in U.S. patent application Ser. No. 11/782,105, filed on Jul. 24, 2007, entitled CONFIGURABLE FUSE MECHANISM FOR IMPLEMENTING MICROCODE PATCHES, which is hereby incorporated by reference in its entirety for all purposes); feature control registers of the microprocessor 100 used to enable or disable and/or indicate the presence or absence of features or functional units of the microprocessor 100, such as a floating point unit (FPU), an MMX unit, an SSE unit, caches and translation-lookaside buffers (TLBs), a call/return stack, a random number generator, an encryption engine, a fused-multiply-add instruction feature, microcode patch-related features, virtual machine extensions (VMX), performance monitoring features, processor stepping and family information, prefetching features, branch prediction features, features related to page table walking, and power management features; configuration registers of the microprocessor 100, for controlling the frequency of one or more clock signals within the microprocessor 100 or controlling voltage levels within the microprocessor 100, among other things.

In a conventional microprocessor, the values are read from fuses and written to the control hardware without the benefit of error detection and correction. As discussed above, if a blown fuse has re-grown such that it will conduct and incorrectly be read as a zero instead of a one, there is a high likelihood that the conventional microprocessor will not operate properly because the value written to one of the control hardware is incorrect. However, advantageously, the microprocessor 100 according to the present invention also includes the EDAC fuses 132 that are used to detect an incorrect value read from the data fuses 152 due to a re-grown fuse 172 and to correct the incorrect value so that the correct value is written the control hardware 124, as described in detail herein.

The microprocessor 100 also includes an instruction cache 102 that caches program instructions fetched and executed by the microprocessor 100. The program instructions may include user program instructions, such as system software or application programs or utilities.

The microprocessor 100 also includes an instruction translator 104 that receives instructions from the instruction cache 102 and, in the case of some instructions of the macroinstruction set of the microprocessor 100, translates the instructions (also referred to as macroinstructions) into one or more microinstructions that are actually executed by execution units 114 of the microprocessor 100. The microinstructions tend to be simpler than the macroinstructions. However, for some instructions of the macroinstruction set of the microprocessor 100, the instruction translator 104 transfers control to microcode sequences of microinstructions stored in a microcode ROM (not shown) of a microcode unit 116.

The microcode ROM of the microcode unit 116 also stores sequences of microinstructions of reset microcode 122. When the microprocessor 100 is reset, the microcode unit 116 begins fetching and executing microinstructions of the reset microcode 122. The reset microcode 122 performs various operations to initialize the microprocessor 100 to prepare it to begin fetching and executing user program instructions. In particular, the reset microcode 122 programs the control hardware 124 of the microprocessor 100 with the control value 134. The microprocessor 100 generates the control value 134 based on the values read from the fuses 172, which are blown at manufacturing time. However, as discussed above, the fuses 172 may re-grow after having been blow such that they change their value from a blown value to a non-blown value. Advantageously, the microprocessor 100 also includes the EDAC fuses 132 that enable the microprocessor 100 to correct errors in the value read from the data fuses 152.

The microprocessor 100 also includes an instruction dispatcher 106 that receives microinstructions, either from the instruction translator 104 or from the microcode unit 116, such as the instructions of the reset microcode 122, and dispatches the microinstructions to the execution units 114. The execution units 114 include one or more integer units that include arithmetic and logic units for performing arithmetic and logical operations. In particular, the execution units 138 are configured to perform Boolean exclusive-OR (XOR) operations on input operands, which the reset microcode 122 uses to perform the EDAC algorithm to detect and correct errors in the values read from the fuses 172. The execution units 138 also execute instructions that read data from and write data to the control hardware 124.

The execution units 138 also execute instructions that read data from and write data to a temporary storage 144. In one embodiment, the temporary storage 144 is a random access memory (RAM). In one embodiment, the RAM is substantially as described in U.S. patent application Ser. No. 12/034,503, filed Feb. 20, 2008, entitled MICROPROCESSOR WITH PRIVATE MICROCODE RAM, which claims priority to U.S. Provisional Application 60/910,982, filed on Apr. 4, 2007, both of which are hereby incorporated by reference in their entirety for all purposes. In particular, as described below with respect to FIG. 3, the reset microcode 122: reads the data fuses 152 and writes the value read into the temporary storage 144 as data fuse value 126; reads the EDAC fuses 132 and writes the value read into the temporary storage 144 as EDAC fuse value 128; and reads the data fuse value 126 and EDAC fuse value 128 to generate a corrected data fuse value 118 that it writes into the temporary storage 144 and subsequently reads from the temporary storage 144 for use in writing to the control hardware 124.

After the microprocessor 100 has read the fuses 172, corrected the data fuse value 126 if necessary, written the control hardware 124, and begun fetching and executing user program instructions (as described below with respect to FIGS. 3 and 5), the microprocessor 100 also reads or writes portions of the control hardware 124 in response to user program instructions requesting to read or write the control hardware 124. In one embodiment, the user program instructions are the x86 architecture RDMSR and WRMSR instructions.

Figure 2:
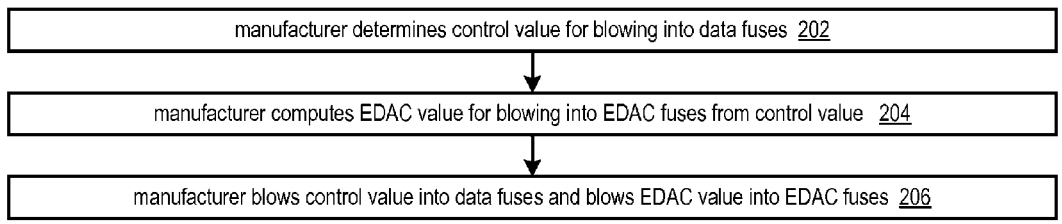
FIG. 2 is a flowchart illustrating steps performed to manufacture the microprocessor of FIG. 1 according to the present invention.

Referring now to FIG. 2, a flowchart illustrating steps performed to manufacture the microprocessor 100 of FIG. 1 according to the present invention is shown. Flow begins at block 202.

At block 202, the microprocessor 100 manufacturer determines the desired control value to be blown into the data fuses 152. Each data fuse 152 constitutes a single bit that has a binary value of either zero or one, depending on whether it is blown or non-blown. The bit value read from each data fuse 152 will be either written directly to a bit of the control hardware 124 or used to generate a bit value that will be written to a bit of the control hardware 124, as described with respect to blocks 312 and 316 of FIG. 3 and block 516 of FIG. 5. Thus, at block 202, the manufacturer determines which of the fuses 172 will be allocated as a data fuse 152 and which of the fuses 172 will be allocated as an EDAC fuse 132, associates each data fuse 152 with a bit in the control hardware 124 and determines the desired bit value to be blown into the data fuse 152. For example, the manufacturer may determine that it wants a particular data fuse 152 to store a bit that is used to selectively toggle a default microcode value that controls whether a particular branch prediction feature of the microprocessor 100 is enabled or disabled, and determines whether it wants the data fuse 152 to be blown or unblown in order to provide the desired binary value to toggle the default value. The manufacturer does this for each data fuse 152. Although each data fuse 152 constitutes a single bit, from the perspective of generating the value to be blown into the EDAC fuses 132 (at block 204 below), the data fuses 152 are viewed as a single entity having a single collective value blown into them, or as a plurality of words each having a single collective value, as discussed more with respect to block 204. In this sense, the single collective value is predetermined prior to manufacture of the microprocessor 100 and prior to its operation after being manufactured. Flow proceeds from block 202 to block 204.

At block 204, the manufacturer applies the EDAC algorithm to the control value determined at block 202 to compute the EDAC value to be blown into the EDAC fuses 132. In one embodiment, the EDAC algorithm is a single error correction double error detection (SECDED) (72,64) Hamming code algorithm such as is well-known in the art of EDAC; however, other EDAC algorithms may be employed in the present invention. Both a vertical code algorithm and a horizontal code algorithm will now be described for use in the embodiment of FIGS. 1 and 3 and the embodiment of FIGS. 4 and 5, respectively.

Figure 3:
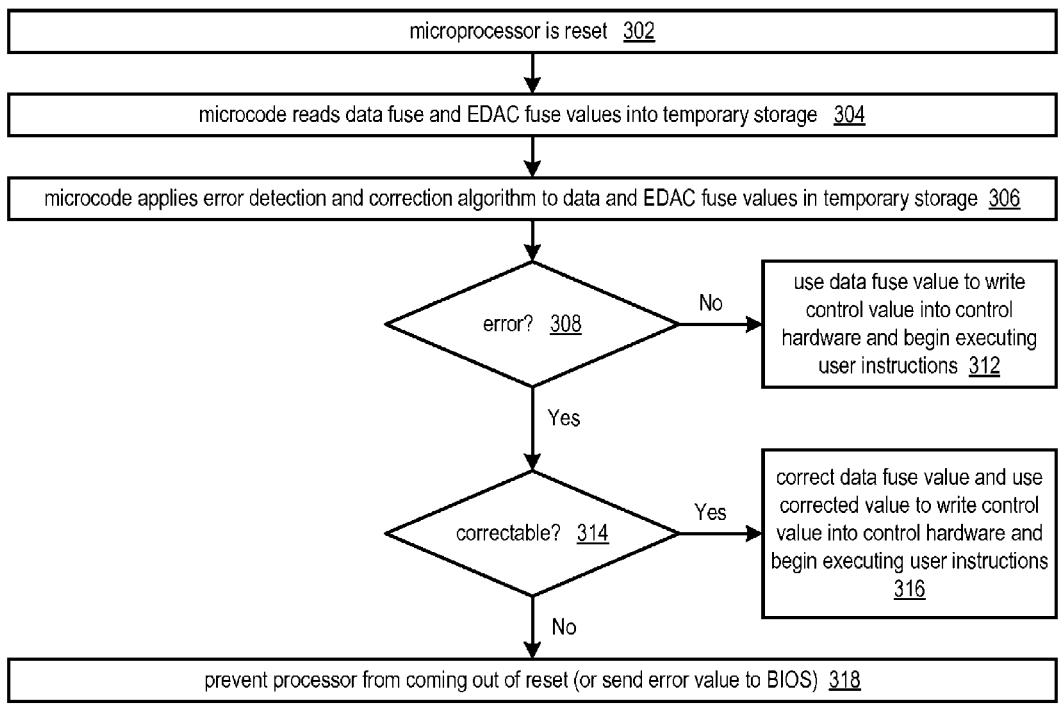
FIG. 3 is a flowchart illustrating operation of the microprocessor of FIG. 1 according to the present invention.

In the embodiment of FIG. 3, the reset microcode 122 of FIG. 1 performs the EDAC algorithm in software to read the fuses 172 and detect and correct errors therein at block 306. Hence, in this embodiment, the manufacturer employs a vertical code algorithm to compute the EDAC value, and the reset microcode 122 employs the vertical code algorithm at block 306. In one embodiment, the fuses 172 are configured as 58 banks, with each bank having 64 fuses, i.e., each bank is 64 bits wide. (A similar embodiment is described in U.S. patent application Ser. No. 12/141,387, filed on Jun. 8, 2008, entitled MICROPROCESSOR WITH PROGRAM-ACCESSIBLE RE-WRITABLE NON-VOLATILE STATE EMBODIED IN BLOWABLE FUSES OF THE MICROPROCESSOR, which is hereby incorporated by reference in its entirety for all purposes.) The first 50 banks are logically allocated as banks for data fuses 152 and the last 8 banks are logically allocated as banks for EDAC fuses 132. Thus, the control value determined at block 202 is logically 50 control words of 64 bits each, and the EDAC algorithm generates 8 EDAC words that are 64 bits each. The manufacturer applies the EDAC algorithm on bit slices of the 50 control words. That is, the manufacturer applies the EDAC algorithm to the bits in bit position 0 of the 50 control words to generate the 8 EDAC word bits in bit position 0, the manufacturer applies the EDAC algorithm to the bits in bit position 1 of the 50 control words to generate the 8 EDAC word bits in bit position 1, and so forth. (Since the EDAC algorithm assumes 64 input bits to generate 8 EDAC bits, but there are only 50 control words, the manufacturer assumes all the bits in the "missing" 14 control words as zero).

Figure 4:
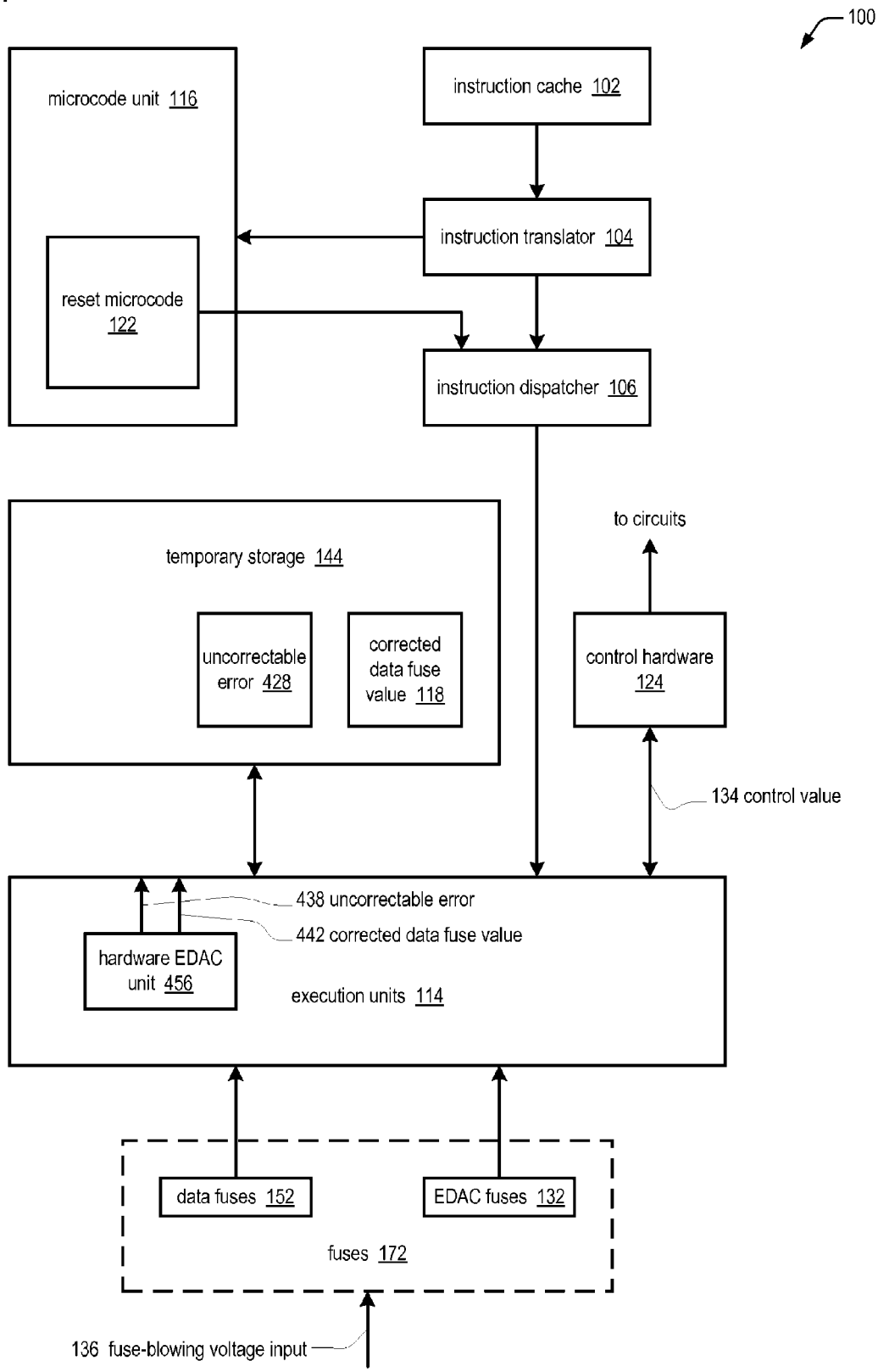
FIG. 4 is a block diagram illustrating a microprocessor according to an alternate embodiment of the present invention.
Figure 5:
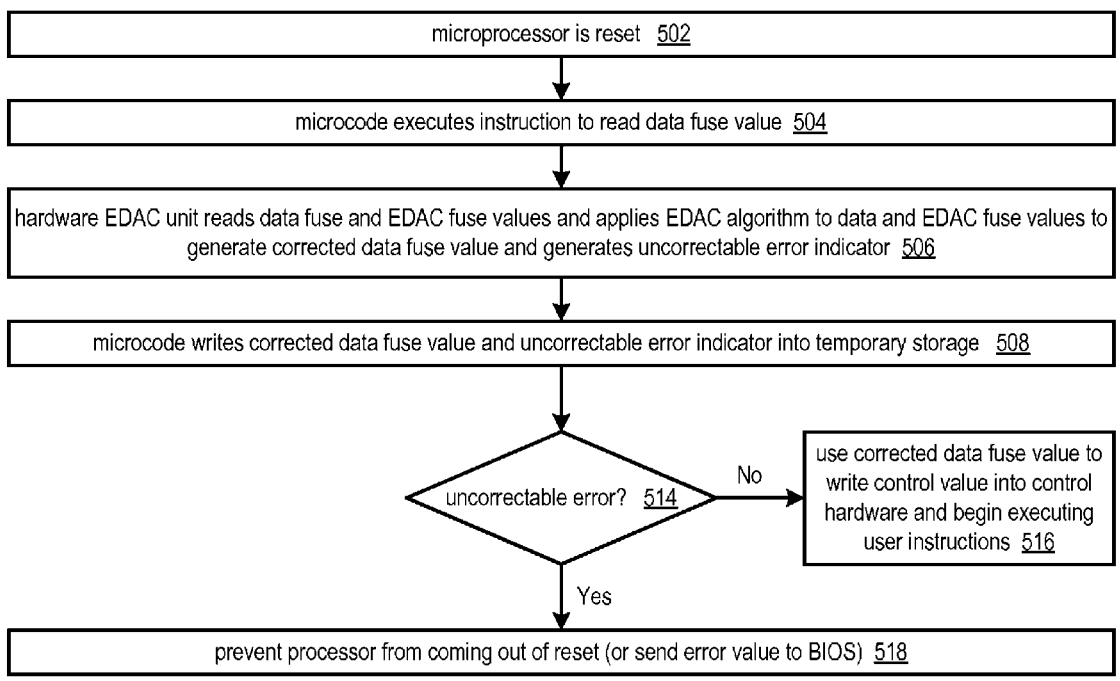
FIG. 5 is a flowchart illustrating operation of the microprocessor of FIG. 4 according to an alternate embodiment of the present invention.

In the alternate embodiment of FIG. 5, the hardware EDAC unit 456 of FIG. 4 performs the EDAC algorithm in hardware to read the fuses 172 and detect and correct errors therein at block 506. Hence, in this embodiment, the manufacturer employs a horizontal code algorithm to compute the EDAC value, and the EDAC unit 456 employs the horizontal code algorithm at block 506. In one embodiment, the fuses 172 are configured as 50 banks, with each bank having 72 fuses, i.e., each bank is 72 bits wide. The fuses in the first 64 bit positions of each bank are logically allocated as data fuses 152 and the fuses in the last 8 bit positions of each bank are logically allocated as EDAC fuses 132. Thus, as in the embodiment of the previous paragraph, the control value determined at block 202 is logically 50 control words of 64 bits each; however, in this embodiment, the EDAC algorithm generates 50 EDAC words that are 8 bits each. The manufacturer applies the EDAC algorithm on a bank-by-bank basis. That is, the manufacturer applies the EDAC algorithm to the 64-bit control word associated with bank 0 to generate the 8-bit EDAC word associated with bank 0, the manufacturer applies the EDAC algorithm to the 64-bit control word associated with bank 1 to generate the 8-bit EDAC word associated with bank 1, and so forth. Flow proceeds from block 204 to block 206.

At block 206, the manufacturer blows the control value determined at block 202 into the data fuses 152 and blows the EDAC value computed at block 204 into the EDAC fuses 132. Flow ends at block 206.

Referring now to FIG. 3, a flowchart illustrating operation of the microprocessor 100 of FIG. 1 according to the present invention is shown. Flow begins at block 302.

At block 302, the microprocessor 100 is reset and responsively begins fetching and executing instructions of the reset microcode 122. Flow proceeds to block 304.

At block 304, the reset microcode 122 reads the data fuses 152 and EDAC fuses 132 and writes the data fuse value 126 and EDAC fuse value 128 into the temporary storage 144. In one embodiment, the microinstruction set of the microprocessor includes an instruction to move the value of a bank of the fuses 172 into a general purpose register (not shown) of the microprocessor 100, and an instruction to move a value from a general purpose register to the temporary storage 144. Furthermore, one of the execution units 138 is adapted to execute these instructions. The reset microcode 122 uses a sequence associated with each of the fuse 172 banks that includes one instruction to read each fuse 172 bank and another instruction to write the value 126/128 into the temporary storage 144. Flow proceeds to block 306.

At block 306, the reset microcode 122 applies the EDAC algorithm to the data fuse value 126 and EDAC fuse value 128 in the temporary storage 144 to determine whether there is an error in the data fuse value 126 and, if so, whether it is correctable. In one embodiment, the microinstruction set of the microprocessor includes an instruction to move a value from the temporary storage 144 to a general purpose register, instructions to perform arithmetic and logical operations (such as exclusive-OR, shift, or rotate) on values in the general purpose registers, and an instruction to move a value from a general purpose register to the temporary storage 144. Furthermore, one of the execution units 138 is adapted to execute these instructions. The reset microcode 122 uses a sequence of these instructions to apply the EDAC algorithm to the data fuse value 126 and EDAC fuse value 128 in the temporary storage 144 to determine whether there is an error in the data fuse value 126 and, if so, whether it is correctable. In one embodiment, the reset microcode 122 employs a vertical code algorithm, as described above with respect to FIG. 2. Flow proceeds to decision block 308.

At decision block 308, the reset microcode 122 determines whether there is an error in the data fuse value 126 based on the operation performed at block 306. If so, flow proceeds to block 314; otherwise, flow proceeds to decision block 312.

At block 312, the reset microcode 122 uses the data fuse value 126 to write the control value 134 into the control hardware 124. Once the control value 134 is written into the control hardware 124, the microprocessor 100 may begin executing user program instructions. In one embodiment, the reset microcode 122 writes the data fuse value 126 directly into the control hardware 124. In another embodiment, the reset microcode 122 modifies the data fuse value 126 to generate the control value 134 for writing into the control hardware 124. For example, in one embodiment, the reset microcode 122 exclusive-ORs the data fuse value 126 with a default control value stored as a constant in the reset microcode 122 and writes the resulting control value 134 to the control hardware 124. This enables the data fuse value 126 to serve as a toggling mechanism to toggle the microcode default control value, as described in U.S. Pat. No. 5,889,679, which is hereby incorporated by reference in its entirety for all purposes. Furthermore, because the control hardware 124 may be multiple different types of hardware as discussed above (e.g., microcode patch hardware, feature control registers, configuration registers) and the data fuse value 126 may have multiple different corresponding portions that include multiple different types of control values, the reset microcode 122 may write some portions of the data fuse value 126 directly into portions of the control hardware 124 and may modify other portions of the data fuse value 126 before writing to the control hardware 124. Furthermore, it should be understood that the reset microcode 122 may execute a sequence of instructions to read the data fuse value 126 from the temporary storage 144 and write the portions of the data fuse value 126 (or modified portions thereof) to the control hardware 124. Flow ends at block 312.

At decision block 314, the reset microcode 122 determines whether the error detected at blocks 306/308 is correctable using the EDAC fuse value 128. If so, flow proceeds to block 316; otherwise, flow proceeds to block 318.

At block 316, the reset microcode 122 corrects the erroneous data fuse value 126 using the EDAC algorithm to generate the corrected data fuse value 118 and uses the corrected data fuse value 118 to write as the control value 134 into the control hardware 124. Once the control value 134 is written into the control hardware 124, the microprocessor 100 may begin executing user program instructions. As discussed above with respect to block 312, the reset microcode 122 may modify the corrected data fuse value 118, or a portion thereof, before writing it to the control hardware 124. Flow ends at block 316.

At block 318, the reset microcode 122 prevents the microprocessor 100 from coming out of reset because the number of bits in error in the data fuse value 126 is too great for the microprocessor 100 to correct using the EDAC fuse value 128. That is, the reset microcode 122 prevents the microprocessor 100 from fetching and executing user program instructions. In an alternate embodiment, the reset microcode 122 allows the microprocessor 100 to come out of reset, i.e., to fetch and execute user program instructions such as BIOS or other system software; however, the reset microcode 122 sends an error status to the system software to indicate that there was an uncorrectable error in the data fuse value 126. Flow ends at block 318.

Referring now to FIG. 4, a block diagram illustrating a microprocessor 100 according to an alternate embodiment of the present invention is shown. The microprocessor 100 of FIG. 4 is similar to the microprocessor 100 of FIG. 1 in many respects and like-number elements are similar. However, the microprocessor 100 of FIG. 4 is different from the microprocessor 100 of FIG. 1 in the following ways. The microprocessor 100 of FIG. 4 includes a hardware error detection and correction (EDAC) unit 456 within the execution units 114. The EDAC unit 456, in response to a microcode instruction, reads the fuses 172 and applies the EDAC algorithm to the values read from the fuses 172 to generate a hardware corrected data fuse value 442. The EDAC unit 456 also generates a true value on an uncorrectable error indicator 438 if it detects an error in the value read from the fuses 172 that it is unable to correct, and otherwise generates a false value on the uncorrectable error indicator 438. Additionally, the reset microcode 122 stores the hardware corrected data fuse value 442 generated by the EDAC unit 456 to the temporary storage 144 as corrected data fuse value 118 and the uncorrectable error indicator 438 value generated by the EDAC unit 456 to the temporary storage 144 as uncorrectable error value 428. Finally, the reset microcode 122 is modified such that, instead of performing the operations described with respect to FIG. 3, it performs operations as described with respect to FIG. 5. In one embodiment, the EDAC unit 456 also generates a second indicator (not shown) to indicate that a correctable error was corrected, which may be useful for informing system software that a fuse has potentially re-grown so that a user can replace the microprocessor 100 if desired.

Referring now to FIG. 5, a flowchart illustrating operation of the microprocessor 100 of FIG. 4 according to an alternate embodiment of the present invention is shown. Flow begins at block 502.

At block 502, the microprocessor 100 is reset and responsively begins fetching and executing instructions of the reset microcode 122. Flow proceeds to block 504.

At block 504, the reset microcode 122 executes the microcode instruction that instructs the EDAC unit 456 to read the fuses 172 and apply the EDAC algorithm to the values read from the fuses 172 to generate the hardware corrected data fuse value 442 and the uncorrectable error indicator 438. In one embodiment, the reset microcode 122 includes instruction that instructs the EDAC unit 456 to read the fuses 172 and apply the EDAC algorithm to the values read from the fuses 172 for each fuse 172 bank. Flow proceeds to block 506.

At block 506, the EDAC unit 456 reads the fuses 172 and applies the EDAC algorithm to the values read from the fuses 172 to generate the hardware corrected data fuse value 442 and the uncorrectable error indicator 438. In one embodiment, the EDAC unit 456 employs a horizontal code algorithm to each fuse 172 bank, as described above with respect to FIG. 2. Flow proceeds to block 508.

At block 508, the reset microcode 122 stores the hardware corrected data fuse value 442 generated by the EDAC unit 456 to the temporary storage 144 as corrected data fuse value 118 and the uncorrectable error indicator 438 value generated by the EDAC unit 456 to the temporary storage 144 as uncorrectable error value 428. Flow proceeds to decision block 514.

At decision block 514, the reset microcode 122 examines the uncorrectable error value 428 in the temporary storage 144 to determine whether there is an uncorrectable error in the value read from the data fuses 152. If so, flow proceeds to block 518; otherwise, flow proceeds to block 516.

At block 516, the reset microcode 122 uses the corrected data fuse value 118 to write the control value 134 into the control hardware 124, as discussed above with respect to block 312 of FIG. 3. Once the control value 134 is written into the control hardware 124, the microprocessor 100 may begin executing user program instructions. Flow ends at block 516.

At block 518, the reset microcode 122 prevents the microprocessor 100 from coming out of reset (or sends an error status to the system software) because the number of bits in error in the data fuse value 126 is too great for the microprocessor 100 to correct using the EDAC fuse value 128, as described above with respect to block 318 of FIG. 3. Flow ends at block 518.

Although the various embodiments have been described using particular EDAC algorithms and particular allocation of the fuses 172 as data fuses 152 or EDAC fuses, other embodiments are contemplated, and the present invention is not limited to the particular algorithms and allocations described herein.

While various embodiments of the present invention have been described herein, it should be understood that they have been presented by way of example, and not limitation. It will be apparent to persons skilled in the relevant computer arts that various changes in form and detail can be made therein without departing from the scope of the invention. For example, software can enable, for example, the function, fabrication, modeling, simulation, description and/or testing of the apparatus and methods described herein. This can be accomplished through the use of general programming languages (e.g., C, C++), hardware description languages (HDL) including Verilog HDL, VHDL, and so on, or other available programs. Such software can be disposed in any known computer usable medium such as semiconductor, magnetic disk, or optical disc (e.g., CD-ROM, DVD-ROM, etc.). Embodiments of the apparatus and method described herein may be included in a semiconductor intellectual property core, such as a microprocessor core (e.g., embodied in HDL) and transformed to hardware in the production of integrated circuits. Additionally, the apparatus and methods described herein may be embodied as a combination of hardware and software. Thus, the present invention should not be limited by any of the exemplary embodiments described herein, but should be defined only in accordance with the following claims and their equivalents. Specifically, the present invention may be implemented within a microprocessor device which may be used in a general purpose computer. Finally, those skilled in the art should appreciate that they can readily use the disclosed conception and specific embodiments as a basis for designing or modifying other structures for carrying out the same purposes of the present invention without departing from the scope of the invention as defined by the appended claims.

We claim:

1. A microprocessor, comprising:
control hardware, configured to receive and store control values and to provide the control values to circuits of the microprocessor for controlling operation of the microprocessor;
a first plurality of fuses, selectively blown collectively with a predetermined value; and
a second plurality of fuses, selectively blown collectively with an error correction value computed from the predetermined value collectively blown into the first plurality of fuses;
wherein, in response to being reset, the microprocessor is configured to:
read the first and second plurality of fuses;
detect an error in the value read from the first plurality of fuses using the value read from the second plurality of fuses;
correct the value read from the first plurality of fuses back to the predetermined value using the value read from the second plurality of fuses; and
use the corrected predetermined value to write the control values into the control hardware;
wherein at least a portion of the circuits of the microprocessor include a clock generation circuit, wherein at least a portion of the control values provided by the control hardware controls a frequency of a clock signal within the microprocessor generated by the clock generation circuit.

2. The microprocessor of claim 1, wherein the microprocessor is configured to use the corrected predetermined value to write the control values into the control hardware, prior to fetching and executing user program instructions.

3. The microprocessor of claim 1, wherein the microprocessor is further configured to prevent itself from fetching and executing user program instructions if the number of bits in error in the value read from the first plurality of fuses is too great for the microprocessor to correct using the value read from the second plurality of fuses.

4. The microprocessor of claim 1, wherein the microprocessor is further configured to report an error to system software if the number of bits in error in the value read from the first plurality of fuses is too great for the microprocessor to correct using the value read from the second plurality of fuses.

5. The microprocessor of claim 1, further comprising:
an error correcting circuit, coupled to the first and second plurality of fuses, configured to detect the error in the value read from the first plurality of fuses using the value read from the second plurality of fuses and to correct the value read from the first plurality of fuses back to the predetermined value using the value read from the second plurality of fuses.

6. The microprocessor of claim 1, wherein the first and second plurality of fuses are configured to be blown collectively with the predetermined value and the error correction value, respectively, during manufacture of the microprocessor.

7. The microprocessor of claim 1, wherein the microprocessor is configured to use an error detection and correction algorithm to detect the error in the value read from the first plurality of fuses using the value read from the second plurality of fuses and to correct the value read from the first plurality of fuses back to the predetermined value using the value read from the second plurality of fuses.

8. The microprocessor of claim 1, further comprising:
microcode, configured to use the corrected predetermined value to write the control values into the control hardware.

9. The microprocessor of claim 8, wherein the microcode is further configured to read the first and second plurality of fuses.

10. The microprocessor of claim 9, wherein the microcode is further configured to detect the error in the value read from the first plurality of fuses using the value read from the second plurality of fuses and to correct the value read from the first plurality of fuses back to the predetermined value using the value read from the second plurality of fuses.

11. The microprocessor of claim 10, further comprising:
a random access memory (RAM), writeable and readable by the microcode, wherein the microcode is further configured read the values from the first and second plurality of fuses into the RAM, and to use the corrected predetermined value to write the control values into the control hardware from the RAM.

12. The microprocessor of claim 8, wherein the control hardware includes an architectural control register, wherein in response to the microprocessor decoding a user program instruction that instructs the microprocessor to read the architectural control register, the microcode is further configured to read a value from the architectural control register and load it into a general purpose register of the microprocessor.

13. The microprocessor of claim 8, wherein the control hardware includes patch hardware configured to store a microcode patch instruction, wherein in response to the microprocessor generating a fetch address to fetch an instruction of the microcode, the patch hardware is configured to provide the patch instruction.

14. The microprocessor of claim 8, wherein at least a portion of the control values provided by the control hardware to the circuits of the microprocessor control whether a feature of the microprocessor is disabled or enabled.

15. The microprocessor of claim 8, wherein at least a portion of the control values provided by the control hardware to the circuits of the microprocessor control power management of the microprocessor.

16. The microprocessor of claim 1, wherein the microprocessor is further configured to modify the corrected predetermined value to generate the control values prior to using the corrected predetermined value to write the control values into the control hardware.

17. A method for initializing a microprocessor involving correcting an incorrect value read from a re-grown blown fuse of the microprocessor, the method comprising:
reading a first and a second plurality of fuses, wherein the first plurality of fuses is selectively blown collectively with a predetermined value, wherein the second plurality of fuses is selectively blown collectively with an error correction value computed from the predetermined value collectively blown into the first plurality of fuses;
detecting an error in the value read from the first plurality of fuses using the value read from the second plurality of fuses;
correcting the value read from the first plurality of fuses back to the predetermined value using the value read from the second plurality of fuses; and
using the corrected predetermined value to write control values into control hardware, wherein the control hardware is configured to receive and store the control values and to provide the control values to circuits of the microprocessor for controlling operation of the microprocessor;
wherein said reading, detecting, correcting, and using are performed in response to the microprocessor being reset;
wherein at least a portion of the circuits of the microprocessor include a clock generation circuit, wherein at least a portion of the control values provided by the control hardware controls a frequency of a clock signal within the microprocessor generated by the clock generation circuit.

18. The method of claim 17, wherein said using the corrected predetermined value to write control values into the control hardware is performed prior to fetching and executing user program instructions.

19. The method of claim 17, further comprising:
preventing the microprocessor from fetching and executing user program instructions if the number of bits in error in the value read from the first plurality of fuses is too great for the microprocessor to correct using the value read from the second plurality of fuses.

20. The method of claim 17, further comprising:
reporting an error to system software if the number of bits in error in the value read from the first plurality of fuses is too great for the microprocessor to correct using the value read from the second plurality of fuses.

21. The method of claim 17, wherein the microprocessor further includes an error correcting circuit, wherein said detecting the error in the value read from the first plurality of fuses using the value read from the second plurality of fuses and said correcting the value read from the first plurality of fuses back to the predetermined value using the value read from the second plurality of fuses are performed by the error correcting circuit.

22. The method of claim 17, wherein the first and second plurality of fuses are configured to be blown collectively with the predetermined value and the error correction value, respectively, during manufacture of the microprocessor.

23. The method of claim 17, wherein said detecting the error in the value read from the first plurality of fuses using the value read from the second plurality of fuses and said correcting the value read from the first plurality of fuses back to the predetermined value using the value read from the second plurality of fuses are performed using an error detection and correction algorithm.

24. The method of claim 17, wherein the microprocessor also includes microcode, wherein said using the corrected predetermined value to write the control values into the control hardware is performed by the microcode.

25. The method of claim 24, wherein said reading the first and second plurality of fuses is performed by the microcode.

26. The method of claim 25, wherein said detecting the error in the value read from the first plurality of fuses using the value read from the second plurality of fuses and said correcting the value read from the first plurality of fuses back to the predetermined value using the value read from the second plurality of fuses is performed by the microcode.

27. The method of claim 26, wherein the microprocessor further includes a random access memory (RAM), wherein said reading the first and second plurality of fuses comprises the microcode reading the values from the first and second plurality of fuses into the RAM, and said using the corrected predetermined value to write control values into the control hardware comprises the microcode using the corrected predetermined value to write the control values into the control hardware from the RAM.

28. The method of claim 24, wherein the control hardware includes an architectural control register, wherein in response to the microprocessor decoding a user program instruction that instructs the microprocessor to read the architectural control register, the microcode reads a value from the architectural control register and loads it into a general purpose register of the microprocessor.

29. The method of claim 24, wherein the control hardware includes patch hardware configured to store a microcode patch instruction, wherein in response to the microprocessor generating a fetch address to fetch an instruction of the microcode, the patch hardware provides the patch instruction.

30. The method of claim 24, wherein at least a portion of the control values provided by the control hardware to the circuits of the microprocessor control whether a feature of the microprocessor is disabled or enabled.

31. The method of claim 24, wherein at least a portion of the control values provided by the control hardware to the circuits of the microprocessor control power management of the microprocessor.

32. The method of claim 17, further comprising:
modifying the corrected predetermined value to generate the control values prior to said using the corrected predetermined value to write control values into control hardware.

33. A microprocessor, comprising:
control hardware, configured to receive and store control values and to provide the control values to circuits of the microprocessor for controlling operation of the microprocessor;
a first plurality of fuses, selectively blown collectively with a predetermined value;
a second plurality of fuses, selectively blown collectively with an error correction value computed from the predetermined value collectively blown into the first plurality of fuses; and
microcode; and
a random access memory (RAM), writeable and readable by the microcode;
wherein, in response to being reset, the microcode is configured to:
read the first and second plurality of fuses into the RAM;
detect an error in the value read from the first plurality of fuses using the value read from the second plurality of fuses;
correct the value read from the first plurality of fuses back to the predetermined value using the value read from the second plurality of fuses; and
use the corrected predetermined value to write the control values into the control hardware from the RAM.

34. A method for initializing a microprocessor involving correcting an incorrect value read from a re-grown blown fuse of the microprocessor, the method comprising:
wherein the microprocessor includes microcode and a random access memory (RAM);
reading, by the microcode, a first and a second plurality of fuses into the RAM, wherein the first plurality of fuses is selectively blown collectively with a predetermined value, wherein the second plurality of fuses is selectively blown collectively with an error correction value computed from the predetermined value collectively blown into the first plurality of fuses;
detecting, by the microcode, an error in the value read from the first plurality of fuses using the value read from the second plurality of fuses;
correcting, by the microcode, the value read from the first plurality of fuses back to the predetermined value using the value read from the second plurality of fuses; and
using, by the microcode, the corrected predetermined value to write control values into control hardware from the RAM, wherein the control hardware is configured to receive and store the control values and to provide the control values to circuits of the microprocessor for controlling operation of the microprocessor;
wherein said reading, detecting, correcting, and using are performed in response to the microprocessor being reset.

35. A microprocessor, comprising:
control hardware, configured to receive and store control values and to provide the control values to circuits of the microprocessor for controlling operation of the microprocessor;
a first plurality of fuses, selectively blown collectively with a predetermined value;
a second plurality of fuses, selectively blown collectively with an error correction value computed from the predetermined value collectively blown into the first plurality of fuses; and
microcode;
wherein, in response to being reset, the microprocessor is configured to:
read the first and second plurality of fuses;
detect an error in the value read from the first plurality of fuses using the value read from the second plurality of fuses;
correct the value read from the first plurality of fuses back to the predetermined value using the value read from the second plurality of fuses; and
use the corrected predetermined value to write the control values into the control hardware, by the microcode;
wherein the control hardware includes patch hardware configured to store a microcode patch instruction, wherein in response to the microprocessor generating a fetch address to fetch an instruction of the microcode, the patch hardware is configured to provide the patch instruction.

36. A method for initializing a microprocessor involving correcting an incorrect value read from a re-grown blown fuse of the microprocessor, the method comprising:
reading a first and a second plurality of fuses, wherein the first plurality of fuses is selectively blown collectively with a predetermined value, wherein the second plurality of fuses is selectively blown collectively with an error correction value computed from the predetermined value collectively blown into the first plurality of fuses;
detecting an error in the value read from the first plurality of fuses using the value read from the second plurality of fuses;
correcting the value read from the first plurality of fuses back to the predetermined value using the value read from the second plurality of fuses; and
using the corrected predetermined value to write control values into control hardware, wherein the control hardware is configured to receive and store the control values and to provide the control values to circuits of the microprocessor for controlling operation of the microprocessor, wherein the microprocessor also includes microcode, wherein said using the corrected predetermined value to write the control values into the control hardware is performed by the microcode;
wherein said reading, detecting, correcting, and using are performed in response to the microprocessor being reset;
wherein the control hardware includes patch hardware configured to store a microcode patch instruction, wherein in response to the microprocessor generating a fetch address to fetch an instruction of the microcode, the patch hardware provides the patch instruction.

* * * * *